United States Patent
Bahl et al.

(10) Patent No.: US 9,064,928 B2
(45) Date of Patent: Jun. 23, 2015

(54) GROWTH OF MULTI-LAYER GROUP III-NITRIDE BUFFERS ON LARGE-AREA SILICON SUBSTRATES AND OTHER SUBSTRATES

(71) Applicant: National Semiconductor Corporation, Santa Clara, CA (US)

(72) Inventors: Sandeep R. Bahl, Palo Alto, CA (US); Jamal Ramdani, Scarborough, ME (US)

(73) Assignee: NATIONAL SEMICONDUCTOR CORPORATION, Santa Clara, CA (US)

( * ) Notice: Subject to any disclaimer, the term of this patent is extended or adjusted under 35 U.S.C. 154(b) by 0 days.

(21) Appl. No.: 14/059,613

(22) Filed: Oct. 22, 2013

(65) Prior Publication Data
US 2014/0042458 A1    Feb. 13, 2014

Related U.S. Application Data

(62) Division of application No. 12/807,336, filed on Sep. 2, 2010, now Pat. No. 8,592,292.

(51) Int. Cl.
*H01L 21/02* (2006.01)
*H01L 21/762* (2006.01)
(Continued)

(52) U.S. Cl.
CPC .......... *H01L 21/762* (2013.01); *H01L 21/0237* (2013.01); *H01L 21/02381* (2013.01);
(Continued)

(58) Field of Classification Search
CPC .............. H01L 21/02458; H01L 33/12; H01L 21/02617–21/02653
See application file for complete search history.

(56) References Cited

U.S. PATENT DOCUMENTS

| | | |
|---|---|---|
| 5,239,188 A | 8/1993 | Takeuchi et al. |
| 6,168,659 B1 | 1/2001 | Yuri et al. |

(Continued)

FOREIGN PATENT DOCUMENTS

| | | |
|---|---|---|
| EP | 1 280 190 A1 | 1/2003 |
| JP | 08-316152 | 11/1996 |

(Continued)

OTHER PUBLICATIONS

Abdalla Naem, et al., "Method for Forming High-Quality Gallium Nitride Structures on Silicon or Other Substrates and Related Apparatus", U.S. Appl. No. 12/577,576 filed Oct. 12, 2009.

(Continued)

*Primary Examiner* — Steven J Fulk
(74) *Attorney, Agent, or Firm* — Jacqueline J. Garner; Frank D. Cimino (57) ABSTRACT

A method includes forming a first epitaxial layer over a semiconductor substrate and etching the first epitaxial layer to form multiple separated first epitaxial regions. The method also includes forming a second epitaxial layer over the etched first epitaxial layer. Each epitaxial layer includes at least one Group III-nitride, and the epitaxial layers collectively form a buffer. The method further includes forming a device layer over the buffer and fabricating a semiconductor device using the device layer. The second epitaxial layer could include second epitaxial regions substantially only on the first epitaxial regions. The second epitaxial layer could also cover the first epitaxial regions and the substrate, and the second epitaxial layer may or may not be etched. The device layer could be formed during the same operation used to form the second epitaxial layer.

6 Claims, 6 Drawing Sheets

(51) Int. Cl.
| | |
|---|---|
| *H01L 29/10* | (2006.01) |
| *H01L 29/66* | (2006.01) |
| *H01L 29/778* | (2006.01) |
| *H01L 29/20* | (2006.01) |
| *H01L 29/205* | (2006.01) |
| *H01L 21/76* | (2006.01) |
| *H01L 29/06* | (2006.01) |
| H01L 23/485 | (2006.01) |
| H01L 27/06 | (2006.01) |
| H01L 27/088 | (2006.01) |

(52) U.S. Cl.
CPC .... *H01L21/02458* (2013.01); *H01L 21/02502* (2013.01); *H01L 21/0254* (2013.01); *H01L 21/02639* (2013.01); H01L 23/485 (2013.01); H01L 27/0605 (2013.01); H01L 27/088 (2013.01); *H01L 29/1075* (2013.01); *H01L 29/66462* (2013.01); *H01L 29/7787* (2013.01); *H01L 29/2003* (2013.01); *H01L 29/205* (2013.01); *H01L 21/7605* (2013.01); *H01L 29/0649* (2013.01); H01L 2924/0002 (2013.01)

(56) References Cited

U.S. PATENT DOCUMENTS

| | | | |
|---|---|---|---|
| 6,649,287 | B2 | 11/2003 | Weeks, Jr. et al. |
| 7,294,200 | B2 | 11/2007 | Fujikura et al. |
| 7,301,205 | B2 | 11/2007 | Matsumori |
| 7,312,134 | B2 | 12/2007 | Chidambarrao et al. |
| 7,374,618 | B2 | 5/2008 | Yoshida |
| 7,598,108 | B2 | 10/2009 | Li et al. |
| 2002/0011599 | A1 | 1/2002 | Motoki et al. |
| 2002/0013036 | A1* | 1/2002 | Gehrke et al. ................ 438/462 |
| 2002/0167028 | A1* | 11/2002 | Kunisato et al. ............. 257/200 |
| 2003/0087462 | A1 | 5/2003 | Koide et al. |
| 2004/0063300 | A1 | 4/2004 | Chi |
| 2005/0104131 | A1 | 5/2005 | Chidambarrao et al. |
| 2005/0124143 | A1 | 6/2005 | Roycroft et al. |
| 2005/0285150 | A1 | 12/2005 | Birner et al. |
| 2006/0148200 | A1 | 7/2006 | Woo |
| 2007/0105274 | A1 | 5/2007 | Fitzgerald |
| 2007/0105335 | A1 | 5/2007 | Fitzgerald |
| 2007/0155121 | A1 | 7/2007 | Frohberg et al. |
| 2007/0164269 | A1* | 7/2007 | Okuyama ....................... 257/13 |
| 2007/0298593 | A1 | 12/2007 | Yu et al. |
| 2008/0296625 | A1 | 12/2008 | Li et al. |
| 2009/0085166 | A1 | 4/2009 | Iwamuro |
| 2011/0031529 | A1 | 2/2011 | Miura et al. |
| 2011/0037099 | A1* | 2/2011 | Takada et al. ................. 257/190 |

FOREIGN PATENT DOCUMENTS

| | | |
|---|---|---|
| WO | 2009015350 A1 | 1/2009 |
| WO | 2009084239 A1 | 7/2009 |
| WO | WO 2009084239 A1 * | 7/2009 |

OTHER PUBLICATIONS

Sandeep R. Bahl, et al., "Growth of Group III Nitride-Based Structures and Integration with Conventional CMOS Processing Tools", U.S. Appl. No. 12/800,606 filed May 19, 2010.

A. Able, et al., "Growth of crack-free GaN on Si(1 1 1) with graded AlGaN buffer layers", Journal of Crystal Growth, 276, Jan. 22, 2005, p. 415-418.

R. Liu, et al., "Atomic arrangement at the AlN/Si (111) interface", Applied Physics Letters, vol. 83, No. 5, Aug. 4, 2003, p. 860-862.

GaN Essentials, AN-011: Substrates for GaN RF Devices', Nitronex Corporation, Jun. 2008, 10 pages.

H. Miyake, et al., "Growth of crack-free AlGaN on selective-area-growth GaN", Journal of Crystal Growth 310, Aug. 22, 2008, p. 4885-4887.

Jamal Ramdani, "Stress Compensation for Large Area Gallium Nitride or Other Nitride-Based Structures on Semiconductor Substrates", U.S. Appl. No. 12/927,947 filed Nov. 30, 2010.

"An STM and LEED study of MOCVD-Prepared P/Ge (100) to (111) Surfaces," Surface Science, Nov. 1, 2004, vol. 571, No. 1-3, pp. 146-156.

* cited by examiner

GROWTH OF MULTI-LAYER GROUP III-NITRIDE BUFFERS ON LARGE-AREA SILICON SUBSTRATES AND OTHER SUBSTRATES

CROSS REFERENCE TO RELATED APPLICATIONS

This application is a divisional of U.S. Nonprovisional patent application Ser. No. 12/807,336, filed Sep. 2, 2010, the contents of which are herein incorporated by reference in its entirety.

TECHNICAL FIELD

This disclosure is generally directed to integrated circuits. More specifically, this disclosure is directed to the growth of multi-layer Group III-nitride buffers on large-area silicon substrates and other substrates.

BACKGROUND

Gallium nitride (GaN) and other "Group III-nitrides" can be used in manufacturing high-speed or high-power integrated circuit devices. Gallium nitride is often desirable because it can withstand high operating temperatures and can provide high breakdown voltages compared to standard silicon devices. Gallium nitride can also typically provide good high-frequency performance and provide lower on resistances.

Native gallium nitride substrates are not generally available. Instead, gallium nitride epitaxial layers are often formed over silicon-based substrates, such as <111> silicon wafers. However, it is often difficult to form thick high-quality gallium nitride epitaxial layers over large silicon substrates. This is due to a number of factors, including large thermal expansion coefficient mismatches and wafer bowing. More specifically, a gallium nitride epitaxial layer can contract about twice as fast when cooled compared to an underlying silicon substrate. This causes tensile stress in the gallium nitride epitaxial layer, which can lead to wafer bowing and produce cracks in the epitaxial layer. These problems are worse with larger substrates, such as silicon wafers with six-inch or larger diameters.

The inability to form thick high-quality gallium nitride layers can reduce the breakdown voltage of field effect transistors (FETs), high electron mobility transistors (HEMTs), or other devices formed using the gallium nitride layers. Also, the production of circuits on larger substrates is typically desired since the same processing steps can be used to fabricate a larger number of circuits on the substrates, resulting in a production cost reduction per circuit. The inability to form thick high-quality gallium nitride layers over larger substrates can limit or eliminate these cost reductions, resulting in higher-cost circuits. In addition, wafer bowing and epitaxial layer cracking can actually limit the manufacturability of certain gallium nitride-based circuits.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 6, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
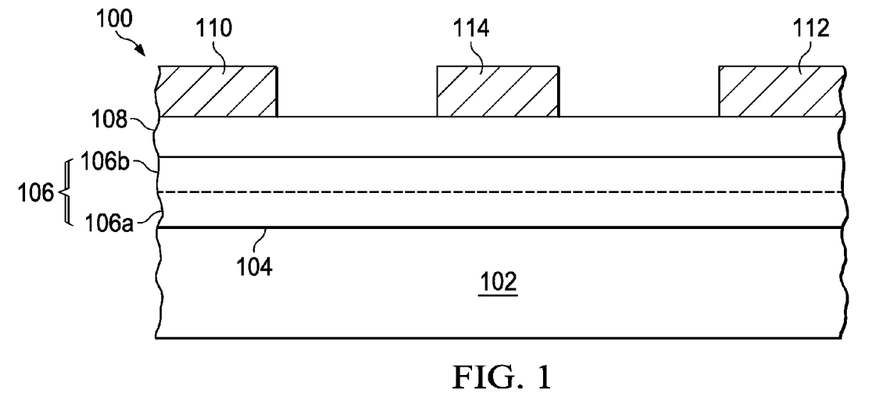
FIG. 1 illustrates an example semiconductor structure having a multi-layer Group III-nitride buffer according to this disclosure.

FIG. 1 illustrates an example semiconductor structure 100 having a multi-layer Group III-nitride buffer according to this disclosure. As shown in FIG. 1, the semiconductor structure 100 includes a substrate 102. The substrate 102 represents any suitable semiconductor substrate that supports or carries other components of the semiconductor structure 100. The substrate 102 could, for example, represent a silicon, sapphire, or silicon carbide substrate. In particular embodiments, the substrate 102 could represent a large-area substrate, such as a <111> silicon wafer with a diameter of at least six inches. A nucleation layer 104 is formed over the substrate 102. The nucleation layer 104 could be formed from any suitable material(s), such as aluminum nitride.

A buffer layer 106 is formed over the nucleation layer 104. The buffer layer 106 typically represents a layer used to help isolate other components in the semiconductor structure 100 from the substrate 102 and to provide a good starting surface (with minimized dislocations) for one or more Group III-nitride devices being formed. The buffer layer 106 could be formed from any suitable material(s), such as a Group III-nitride. A "Group III-nitride" refers to a compound formed using nitrogen and at least one Group III element. Example Group III elements include indium, gallium, and aluminum. Example Group III-nitrides include gallium nitride (GaN), aluminum gallium nitride (AlGaN), indium aluminum nitride (InAlN), indium aluminum gallium nitride (InAlGaN), aluminum nitride (AlN), indium nitride (InN), and indium gallium nitride (InGaN). The buffer layer 106 could be formed in any suitable manner, such as by using a metal-organic chemical vapor deposition (MOCVD) or Molecular Beam Epitaxy (MBE) technique. Note that the formation of the buffer layer 106 can be facilitated by the nucleation layer 104. However, the buffer layer 106 could be formed in a way that does not require the nucleation layer 104, and the layer 104 can be omitted.

At least one Group III-nitride device layer 108 is formed over the buffer layer 106. The Group III-nitride device layer 108 is used to form a portion of at least one semiconductor device, such as a gallium nitride-based field effect transistor (FET) or high electron mobility transistor (HEMT). The Group III-nitride device layer 108 could include any other or additional integrated circuit component(s). The Group III-nitride device layer 108 could be formed from any suitable Group III-nitride material(s). The Group III-nitride device layer 108 could also be formed in any suitable manner, such as during the same operation (like MOCVD or MBE) that is used to form the buffer layer 106. In general, a "device layer" denotes all or a portion of a layer in which at least part of a semiconductor device is formed. A device layer could be formed as an individual layer or as part of another layer (such as an epitaxial layer).

The formation of at least one Group III-nitride device could then be completed using the Group III-nitride device layer(s) 108. For example, an upper portion of the buffer layer 106 or a portion of the device layer 108 could be doped with one or more dopants to create a source, a drain, or other transistor regions. One or more metal or other conductive layers could be patterned and etched to form source and drain contacts 110-112. Active regions in the structure could be isolated from one another, such as by mesa etching or ion-implantation. A gate 114 could be formed by etching, dielectric deposition, and deposition of metal or other conductive material. Connections to other devices or circuit elements could be made using the contacts 110-112 and the gate 114.

In order to help increase the thickness of the buffer layer 106, the buffer layer 106 is fabricated as a multi-layer structure. A first portion 106a of the buffer layer 106 (such as a first Group III-nitride epitaxial layer) can be formed over the substrate 102. The first portion 106a of the buffer layer 106 can be processed, such as by etching the first portion 106a to form isolated epitaxial regions, which helps to relieve stress on the first portion 106a of the buffer layer 106. A second portion 106b of the buffer layer 106 (such as a second Group III-nitride epitaxial layer) is formed over the first portion 106a of the buffer layer 106, and the second portion 106b of the buffer layer 106 can be processed. If desired, one or more additional portions of the buffer layer 106 can be formed at this point.

These different portions could collectively form a buffer layer 106 that is thicker than those obtained using the conventional techniques described above. For example, each epitaxial layer forming the buffer layer 106 could be between 1 μm and 3 μm in thickness (for six-inch and eight-inch diameter <111> silicon substrates, providing a total thickness of up to 6 μm. In general, each epitaxial layer forming the buffer layer 106 could have a thickness at or below its "cracking" thickness, which refers to the minimum thickness at which cracks appear in the epitaxial layer due to stresses from thermal expansion coefficient mismatches, wafer bowing, or lattice mismatch. As a result of the thicker buffer layer 106, the Group III-nitride device(s) formed using the device layer 108 would have a higher breakdown voltage compared to conventional Group III-nitride devices. Moreover, larger silicon wafers or other substrates 102 could be used to fabricate multiple Group III-nitride devices, providing cost reduction per device fabricated. Various techniques for forming the multi-layer Group III-nitride buffer layer 106 are described below. Note that the different portions or layers in the buffer layer 106 could have the same thickness or different thicknesses, and the different portions or layers in the buffer layer 106 could be formed from the same material(s) or from different material(s).

Although FIG. 1 illustrates one example of a semiconductor structure 100 having a multi-layer Group III-nitride buffer, various changes may be made to FIG. 1. For example, any other materials and processes could be used to form various layers or other structures of the semiconductor structure 100. Also, the sizes and shapes of the components in FIG. 1 and the arrangements of those components in FIG. 1 are for illustration only.

Figure 2A:
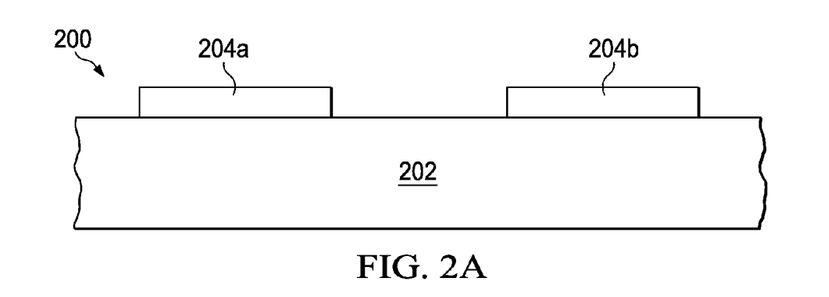
FIGS. 2A through 2D illustrate a first example technique for forming a semiconductor structure having a multi-layer Group III-nitride buffer according to this disclosure.

FIGS. 2A through 2D illustrate a first example technique 200 for forming a semiconductor structure having a multi-layer Group III-nitride buffer according to this disclosure. As shown in FIG. 2A, a substrate 202 is fabricated or provided. The substrate 202 could represent any suitable semiconductor substrate, such as a silicon wafer having a diameter of six inches or more. Note that any other suitable substrate could be used, such as a silicon carbide or sapphire wafer or a smaller silicon wafer.

Epitaxial regions 204a-204b are formed over the substrate 202. The epitaxial regions 204a-204b could be formed from any suitable material(s), such as one or more Group III-nitrides. The epitaxial regions 204a-204b could also have any suitable thickness, such as 1 μm-3 μm (which can typically be formed over larger substrates, like six-inch and eight-inch diameter <111> silicon substrates, without cracking). The epitaxial regions 204a-204b could further be formed using any suitable technique(s), such as by using MOCVD, MBE, or other technique to form an epitaxial layer that is patterned and etched. The epitaxial layer could be formed using a nucleation layer (not shown) over the substrate 202. The epitaxial regions 204a-204b could represent areas of the epitaxial layer where semiconductor devices are to be formed. The removed portions of the epitaxial layer (around and between the epitaxial regions 204a-204b) could represent non-active areas of the epitaxial layer where no semiconductor devices are to be formed.

Figure 2B:
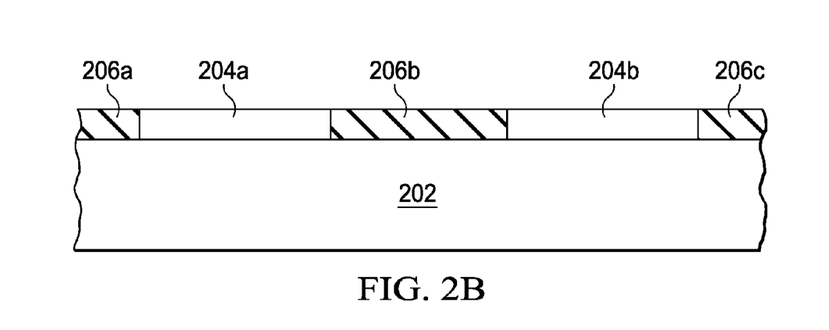

As shown in FIG. 2B, dielectric regions 206a-206c are formed between and around the epitaxial regions 204a-204b. The dielectric regions 206a-206c help to electrically isolate the epitaxial regions 204a-204b. The dielectric regions 206a-206c could be formed from any suitable material(s), such as silicon dioxide ($SiO_2$). Also, the dielectric regions 206a-206c could be formed in any suitable manner, such as by forming a dielectric layer over and between the epitaxial regions 204a-204b and then performing a chemical mechanical polish (CMP) operation. This removes the dielectric layer above the epitaxial regions 204a-204b and planarizes the epitaxial regions 204a-204b and the dielectric regions 206a-206c.

Figure 2C:
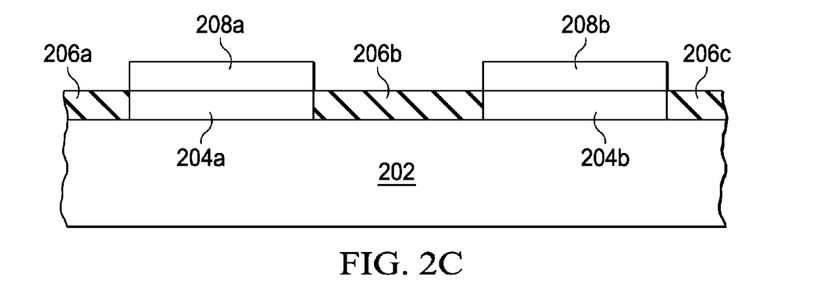

As shown in FIG. 2C, epitaxial regions 208a-208b are formed over the structure. The epitaxial regions 208a-208b could be formed from any suitable material(s), such as one or more Group III-nitrides. The epitaxial regions 208a-208b could also have any suitable thickness, such as 1 μm-3 μm. The epitaxial regions 208a-208b could further be formed using any suitable technique(s), such as selective deposition or growth using MOCVD or MBE. The selective deposition or growth means the epitaxial regions 208a-208b are generally formed over the exposed epitaxial regions 204a-204b, so the epitaxial regions 208a-208b are effectively self-aligned with the epitaxial regions 204a-204b. Some amorphous or other material can be deposited or grown on the dielectric regions 206a-206c during the selective operation, but this material can be removed or allowed to remain if it does not adversely affect operation of semiconductor devices being formed.

Figure 2D:
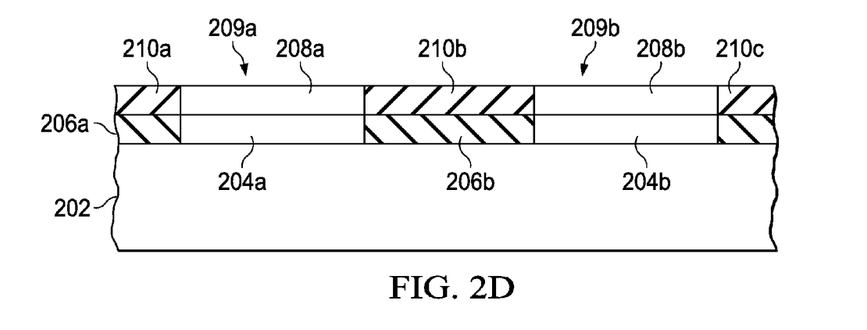

As shown in FIG. 2D, dielectric regions 210a-210c are formed between and around the epitaxial regions 208a-208b, which helps to electrically isolate the epitaxial regions 208a-208b. The dielectric regions 210a-210c could be formed from any suitable material(s), such as $SiO_2$. Also, the dielectric regions 210a-210c could be formed in any suitable manner, such as by depositing a dielectric layer over and between the epitaxial regions 208a-208b and then performing a CMP operation. This removes the dielectric layer above the epitaxial regions 208a-208b and planarizes the epitaxial regions 208a-208b and the dielectric regions 210a-210c.

The epitaxial regions 204a and 208a form a buffer layer 209a in or over which at least one transistor device or other integrated circuit device can be fabricated (assuming a device layer is formed as part of or over the region 208a). Similarly, the epitaxial regions 204b and 208b form a buffer layer 209b in or over which at least one other transistor device or other integrated circuit device can be fabricated (assuming a device layer is formed as part of or over the region 208b). At this point, additional processing steps could occur, such as the formation of Group III-nitride device layers and devices over the epitaxial regions 208a-208b. An example of this is shown in FIGS. 3A and 3B.

Figure 3A:
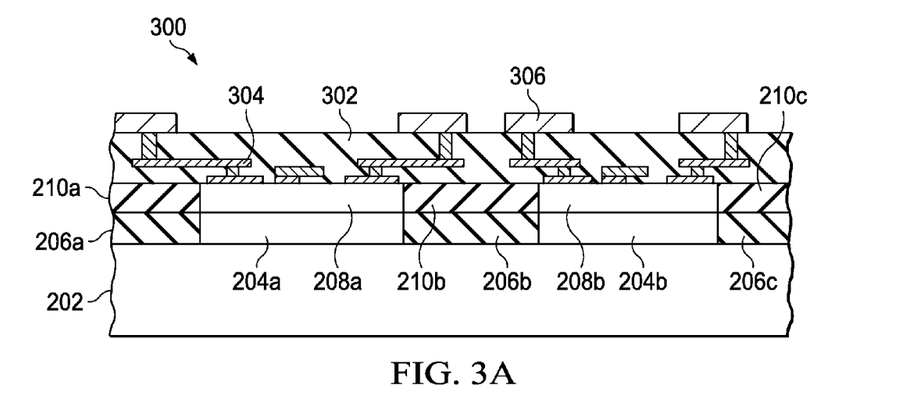
FIGS. 3A and 3B illustrate side and top views of the semiconductor structure formed in FIGS. 2A through 2D according to this disclosure.
Figure 3B:
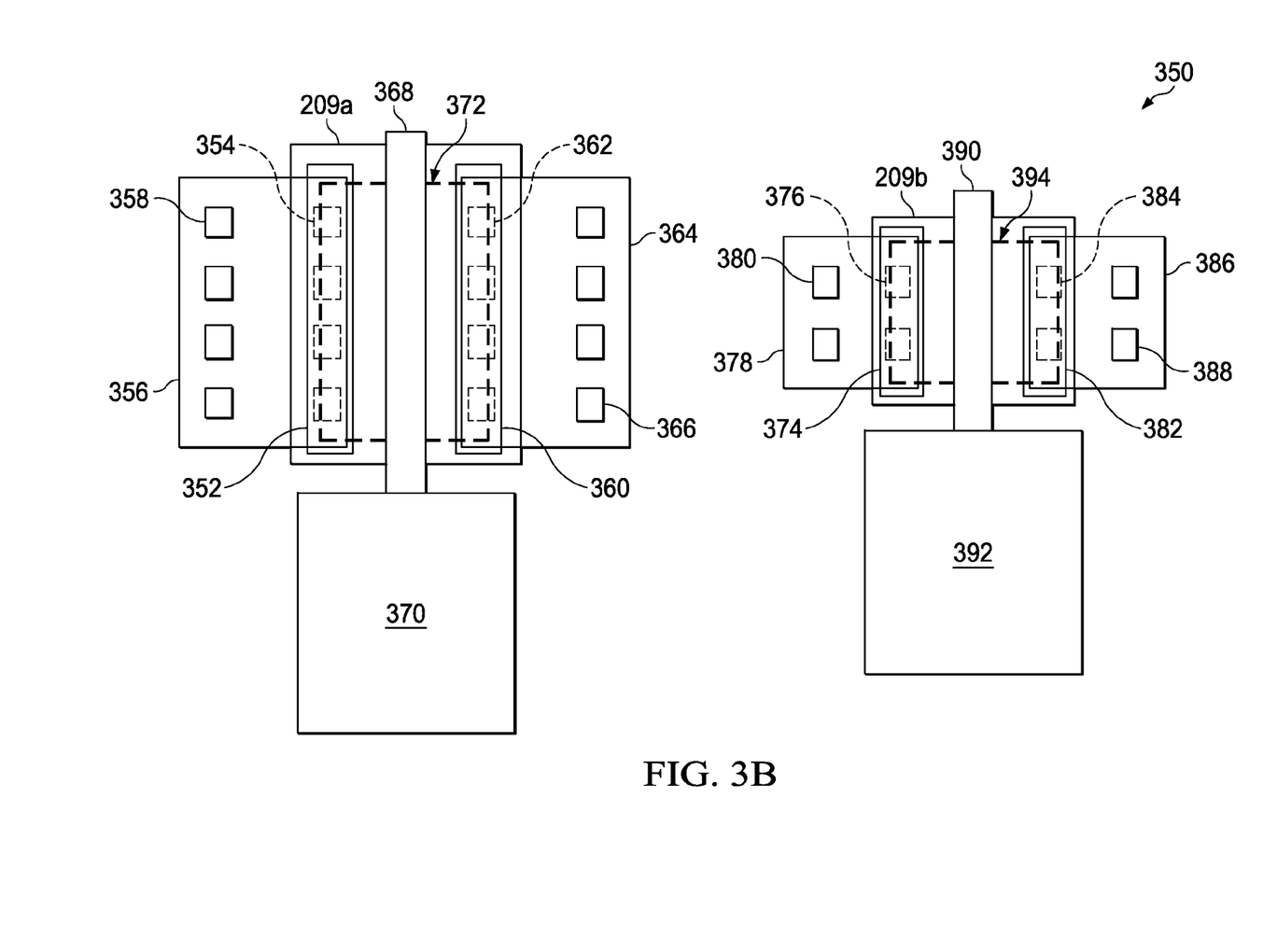

FIGS. 3A and 3B illustrate side and top views of the semiconductor structure formed in FIGS. 2A through 2D according to this disclosure. In particular, FIG. 3A shows a side view 300 of the semiconductor structure, while FIG. 3B shows a top view 350 of the semiconductor structure.

As shown in FIG. 3A, at least one inter-level dielectric (ILD) layer or other dielectric layer 302 is formed over the semiconductor structure of FIG. 2D. This could occur after the Group III-nitride device layers and devices are formed over the semiconductor structure of FIG. 2D. Also, various structures 304 can be formed in the dielectric layer(s) 302. The dielectric layer 302 includes any suitable number of layers formed from any suitable dielectric material(s). The structures 304 could include any suitable structures for coupling to transistor devices or other devices, such as source, drain, and gate contacts, metal interconnects, and conductive plugs. In addition, conductive structures 306 can be formed over the dielectric layer 302 to provide electrical connection to external signal lines. The conductive structures 306 could be formed in any suitable manner using any suitable material(s), such as by depositing and etching a metal layer to form source and drain bond pads over each buffer 209a-209b. These components 304-306 could be fabricated in any suitable manner, such as by using conventional complimentary metal oxide semiconductor (CMOS) back-end manufacturing operations.

In FIG. 3B, a source contact 352 electrically contacts a source formed in the epitaxial region 208a. One or more conductive plugs 354 electrically couple the source contact 352 to a conductive interconnect 356, which is electrically coupled to another component (a source bond pad 306) by one or more conductive plugs 358. Similarly, a drain contact 360 electrically contacts a drain formed in the epitaxial region 208a. One or more conductive plugs 362 electrically couple the drain contact 360 to a conductive interconnect 364, which is electrically coupled to another component (a drain bond pad 306) by one or more conductive plugs 366. A gate 368 is formed over the epitaxial region 208a. The gate 368 is in electrical contact with a gate bond pad 370. The bond pads could be electrically connected to other circuitry in a larger device. An isolation implant (such as one using nitrogen) can be performed outside of a region 372 of the structure to help avoid high voltages at the trench edges of the semiconductor device being formed in the epitaxial region 208a. Other techniques could be used to help isolate the semiconductor device being formed, such as by etching through the device layer and etching a portion of the buffer layer around the area where the semiconductor device is being formed.

In a similar manner, a source contact 374 electrically contacts a source formed in the epitaxial region 208b. One or more conductive plugs 376 electrically couple the source contact 374 to a conductive interconnect 378, which is electrically coupled to another component (a second source bond pad 306) by one or more conductive plugs 380. A drain contact 382 electrically contacts a drain formed in the epitaxial region 208b. One or more conductive plugs 384 electrically couple the drain contact 386 to a conductive interconnect 386, which is electrically coupled to another component (a second drain bond pad 306) by one or more conductive plugs 388. A gate 390 is formed over the epitaxial region 208b. The gate 390 is in electrical contact with a gate bond pad 392. The bond pads could be electrically connected to other circuitry in a larger device. An isolation implant can be performed outside of a region 394 of the structure to help avoid high voltages at the trench edges of the semiconductor device being formed in the epitaxial region 208b. Other isolation techniques could be used.

Each of these components 352-394 could be formed from any suitable material(s) and using any suitable technique(s). In this example, transistor devices of differing sizes are formed using the buffers 209a-209b, although any number of devices could be fabricated in the same or similar manner and have any suitable size(s). Moreover, the epitaxial regions 204a-204b and 208a-208b collectively form thicker buffers 209a-209b, such as buffers up to 6 μm or even more, without significant wafer bowing or cracking. Because the buffers 209a-209b are thicker, the transistor devices formed here could have significantly higher breakdown voltages. In addition, this could be achieved even using large semiconductor substrates, like six-inch or larger silicon wafers, which can provide significant cost savings.

Although FIGS. 2A through 2D illustrate one example of a technique 200 for forming a semiconductor structure having a multi-layer Group III-nitride buffer and FIGS. 3A and 3B illustrate example views of the semiconductor structure, various changes may be made to FIGS. 2A through 2D, 3A, and 3B. For example, each element in the structure could be fabricated using any suitable material(s) and any suitable technique(s). Also, the relative sizes and shapes of the elements in the structure could be modified according to particular needs. In addition, additional components could be formed within the semiconductor structure, such as a nucleation layer or more than two epitaxial regions that are combined to form a single buffer.

Figure 4A:
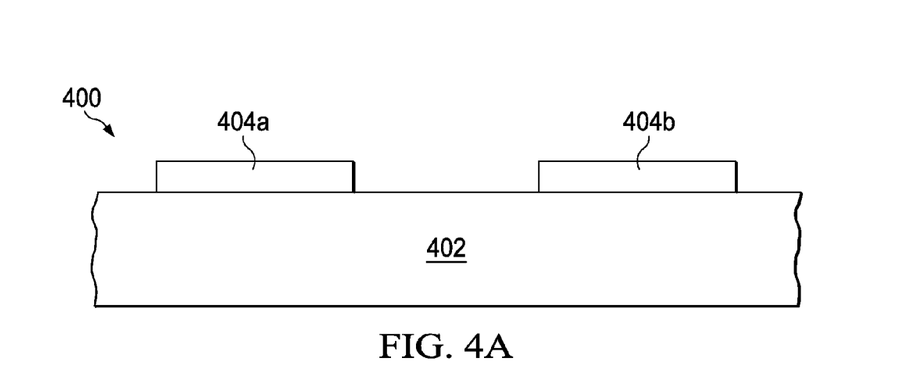
FIGS. 4A through 4C illustrate a second example technique for forming a semiconductor structure having a multi-layer Group III-nitride buffer according to this disclosure.

FIGS. 4A through 4C illustrate a second example technique 400 for forming a semiconductor structure having a multi-layer Group III-nitride buffer according to this disclosure. As shown in FIG. 4A, a substrate 402 is fabricated or provided. Any suitable semiconductor substrate could be used, such as a silicon wafer having a diameter of six inches or more. Epitaxial regions 404a-404b are formed over the substrate 402. The epitaxial regions 404a-404b could be formed from any suitable material(s), such as one or more Group III-nitrides. The epitaxial regions 404a-404b could also have any suitable thickness, such as 1 μm-3 μm. The epitaxial regions 404a-404b could further be formed using any suitable technique(s), such as by using MOCVD, MBE, or other technique to form an epitaxial layer that is patterned and etched. The epitaxial layer could be formed using a nucleation layer (not shown) formed over the substrate 402. Etching the epitaxial layer can help to relieve stress in the epitaxial layer 404.

Figure 4B:
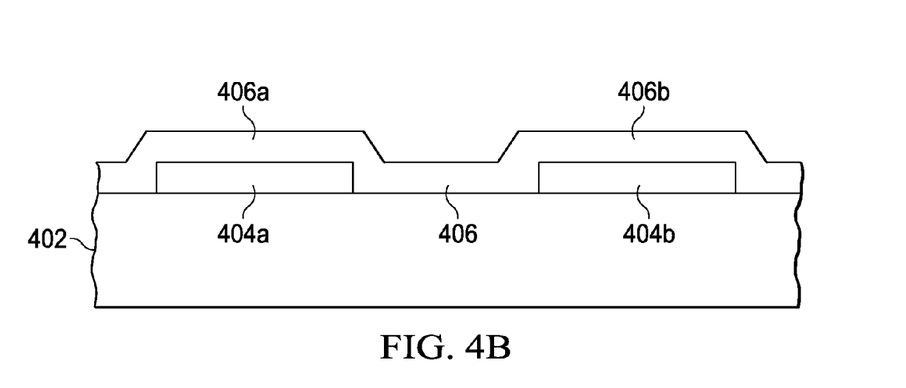

As shown in FIG. 4B, an epitaxial layer 406 is formed over the epitaxial regions 404a-404b and the substrate 402. The epitaxial layer 406 could be formed from any suitable material(s), such as one or more Group III-nitrides. The epitaxial layer 406 could also have any suitable thickness, such as 1 μm-3 μm. The epitaxial layer 406 could further be formed using any suitable technique(s), such as MOCVD or MBE.

Figure 4C:
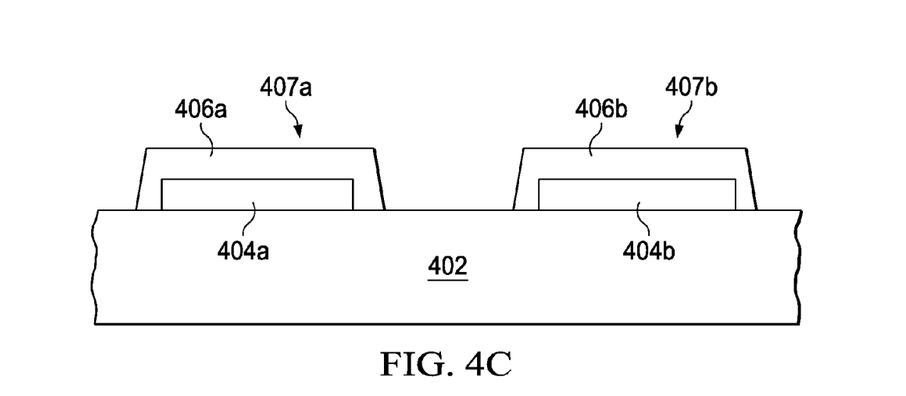

The epitaxial layer 406 could be etched to isolate epitaxial regions 406a-406b of the epitaxial layer 406 as shown in FIG. 4C. The etching can also help to relieve stress in the epitaxial layer 406. The epitaxial regions 404a-404b and the epitaxial regions 406a-406b can form buffers 407a-407b. Transistor devices or other integrated circuit components can be formed in or over the buffers 407a-407b (assuming device layers are formed as part of or over the epitaxial regions 406a-406b). The combined thickness of the epitaxial regions 404a-404b and epitaxial regions 406a-406b can provide higher breakdown voltages for those devices because the combined thickness exceeds the maximum thickness possible by only a single growth. Alternatively, if the epitaxial layer 406 is not grown very thick (such as 1 μm to 3 μm), it can be left unetched in order to reduce processing costs.

Figure 5A:
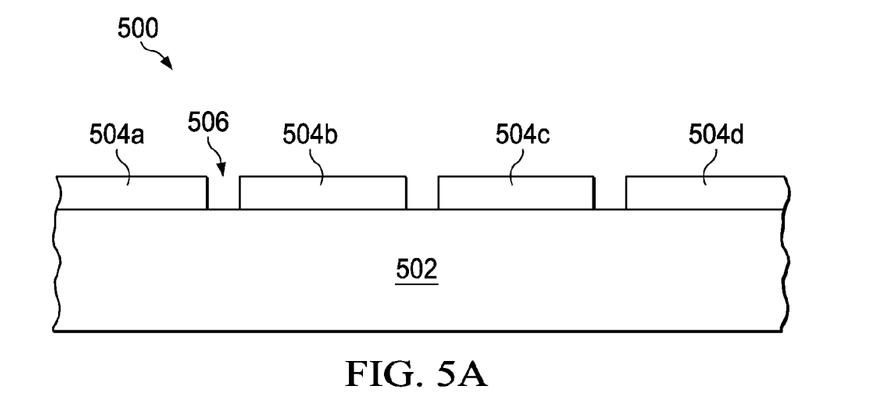
FIGS. 5A through 5C illustrate a third example technique for forming a semiconductor structure having a multi-layer Group III-nitride buffer according to this disclosure.
Figure 5B:
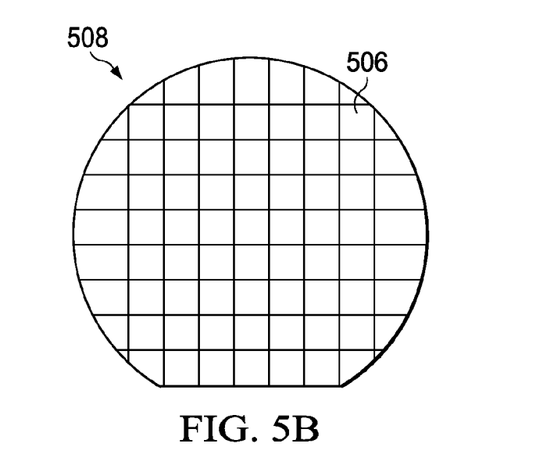

FIGS. 5A through 5C illustrate a third example technique 500 for forming a semiconductor structure having a multi-layer Group III-nitride buffer according to this disclosure. As shown in FIG. 5A, a semiconductor substrate 502 is fabricated or provided. Epitaxial regions 504a-504d are formed over the substrate 502. The epitaxial regions 504a-504d could be formed from any suitable material(s) and in any suitable manner. For instance, the epitaxial regions 504a-504d could be formed by etching a Group III-nitride epitaxial layer. The etching can form trenches 506 between the epitaxial regions 504a-504d, which can help to relieve stress on the epitaxial regions 504a-504d. The etching could occur as shown in FIG. 5B, which shows the trenches 506 forming a grid pattern 508.

Figure 5C:
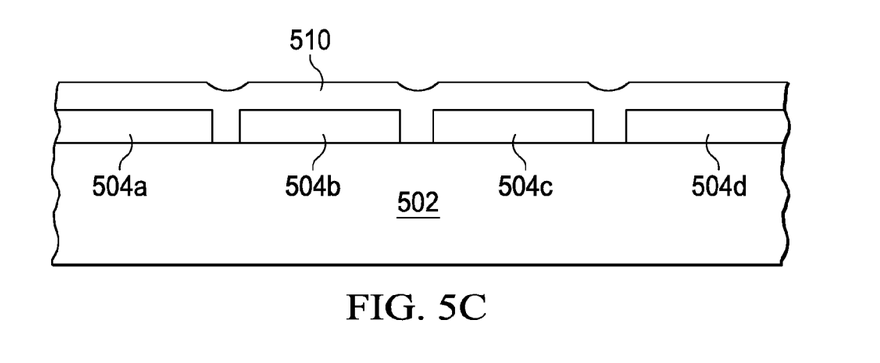

As shown in FIG. 5C, an epitaxial layer 510 is formed in the trenches 506 and over the epitaxial regions 504a-504d and the substrate 502. The epitaxial layer 510 could be formed from any suitable material(s) and in any suitable manner. While not shown, the epitaxial layer 510 could be etched to isolate different regions of the epitaxial layer 510. The etching can also help to relieve stress on the epitaxial layer 510. Regardless of whether the epitaxial layer 510 is etched, transistor devices or other integrated circuit components can be formed in or over regions of the epitaxial layer 510 (assuming a device layer is formed as part of or over the epitaxial layer 510). The combined thickness of the epitaxial regions 502a-502d and the epitaxial layer 510 can provide higher breakdown voltages for those devices because the combined thickness exceeds the maximum thickness possible by only a single growth.

Although FIGS. 4A through 5C illustrate two additional examples of techniques for forming a semiconductor structure having a multi-layer Group III-nitride buffer, various changes may be made to FIGS. 4A through 5C. For example, each element in the structures could be fabricated using any suitable material(s) and any suitable technique(s). Also, the relative sizes and shapes of the elements in the structures could be modified according to particular needs. In addition, additional components could be formed within the semiconductor structures, such as nucleation layers or more than two epitaxial regions that are combined to form a single buffer.

Figure 6:
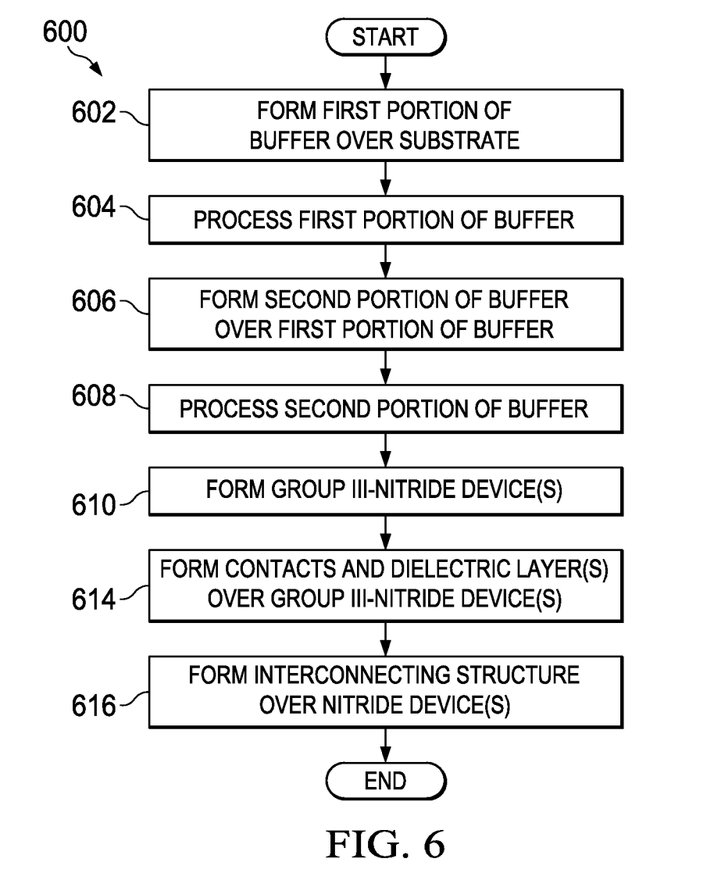
FIG. 6 illustrates an example method for forming a semiconductor structure having a multi-layer Group III-nitride buffer according to this disclosure.

FIG. 6 illustrates an example method 600 for forming a semiconductor structure having a multi-layer Group III-nitride buffer according to this disclosure. For ease of explanation, the method 600 is described with respect to the technique shown in FIGS. 2A through 2D.

As shown in FIG. 6, a first portion of a buffer is formed over a substrate at step 602, and the first portion of the buffer is processed at step 604. This could include, for example, forming the epitaxial regions 204a-204b over the substrate 202. As a particular example, this could include forming an epitaxial layer over the substrate 202, patterning a mask over what is to become epitaxial regions 204a and 204b, and etching the epitaxial layer in areas not protected by the mask to form the epitaxial regions 204a-204b. This could also include forming isolating dielectric regions 206a-206c around the epitaxial regions 204a-204b. Note that a single epitaxial layer or multiple epitaxial layers could be used to form the first portion of the buffer. The layers may be identical or different, and each layer could be uniform or graded. Another technique for forming the first portion of the buffer with isolated regions is disclosed in U.S. patent application Ser. No. 12/577,576, which is hereby incorporated by reference.

A second portion of the buffer is formed over the first portion of the buffer at step 606, and the second portion of the buffer is processed at step 608. This could include, for example, forming the epitaxial regions 208a-208b over the epitaxial regions 204a-204b. As a particular example, this could include forming an epitaxial layer over the epitaxial regions 204a-204b, patterning a mask over what is to become epitaxial regions 208a and 208b, and etching the unmasked epitaxial layer to form the epitaxial regions 208a-208b. As another particular example, this could include selectively forming the epitaxial regions 208a-208b over the epitaxial regions 204a-204b. This could also include forming isolating dielectric regions 210a-210c around the epitaxial regions 208a-208b. Note that the epitaxial regions 208a-208b may represent a buffer and a device layer if any devices are to be formed within the epitaxial regions 208a-208b. The epitaxial regions 204a-204b and 208a-208b collectively form thicker buffers that may not suffer from significant cracking or cause significant wafer bowing. Note that a single epitaxial layer or multiple epitaxial layers could be used to form the second portion of the buffer. The layers may be identical or different, and each layer could be uniform or graded.

One or more Group III-nitride devices are formed over the buffer at step 610. This could include, for example, forming sources, drains, and other device structures in the epitaxial regions 208a-208b or in a device layer 108 formed over the epitaxial regions 208a-208b. Contacts and one or more dielectric layers are formed over the Group III-nitride device(s) at step 614. This could include, for example, forming source, drain, and gate contacts over the Group III-nitride device(s). This could also include forming an ILD layer or other dielectric layer 302 over the Group III-nitride device(s) and over the source, drain, and gate contacts. Interconnect structures are formed over the Group III-nitride device(s) at step 616. This could include, for example, forming conductive interconnects and conductive plugs to couple the source, drain, and gate contacts to bond pads or other structures.

Although FIG. 6 illustrates one example of a method 600 for forming a semiconductor structure having a multi-layer Group III-nitride buffer, various changes may be made to FIG. 6. For example, while shown as a series of steps, various steps in FIG. 6 could overlap, occur in parallel, occur in a different order, or occur multiple times.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A system comprising:
    a semiconductor substrate comprised of a material selected from the group of silicon, sapphire, or silicon carbide;
    a nucleation layer formed over the substrate composed of aluminum nitride;
    a buffer layer formed over the nucleation layer, comprising a plurality of separated first epitaxial regions wherein, the plurality of separated first epitaxial regions form isolated component islands wherein, the component islands are configured to provide a starting surface structured to minimize dislocations;
    at least one Group III-nitride second epitaxial layer formed over the buffer layer wherein, the Group III-nitride layer is configured to form a device layer having a portion of a semiconductor device;
    the portion of the device layer doped with one or more dopants to form a source, a drain, or other transistor regions; and
    one or more conductive layers formed over the transistor region, patterned and etched to form source and drain contacts.

2. The system of claim 1, wherein the at least one Group III-nitride device layer comprises multiple separated second epitaxial regions, the second epitaxial regions substantially formed only on the first epitaxial regions.

3. The system of claim 1, wherein the second epitaxial layer comprises epitaxial material that covers the first epitaxial regions and at least a portion of the substrate.

4. The system of claim 1, wherein:
    the second epitaxial layer comprises multiple separated second epitaxial regions; and
    the system further comprises multiple dielectric regions electrically separating the first epitaxial regions from one another and electrically separating the second epitaxial regions from one another.

5. The system of claim 1, further comprising:
    an isolation region in the device layer and at least a portion of the buffer, the isolation region configured to isolate the semiconductor device.

6. The system of claim 1, wherein:
    the substrate comprises a <111> silicon wafer having a diameter of at least six inches;
    the at least one Group III-nitride comprises one or more of: gallium nitride (GaN), aluminum gallium nitride (AlGaN), indium aluminum nitride (InAlN), indium aluminum gallium nitride (InAlGaN), aluminum nitride (AlN), indium nitride (InN), and indium gallium nitride (InGaN);
    the first epitaxial layer has a thickness of 1 μm to 3 μm; and
    the second epitaxial layer has a thickness of 1 μm to 3 μm.

* * * * *